US012812824B2

(12) United States Patent
Watai et al.

(10) Patent No.: US 12,812,824 B2
(45) Date of Patent: Nov. 24, 2026

(54) POWER CONVERSION DEVICE

(71) Applicant: Mitsubishi Electric Corporation, Tokyo (JP)

(72) Inventors: Atsuki Watai, Tokyo (JP); Yukio Nakashima, Tokyo (JP); Hiroyuki Ushifusa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 255 days.

(21) Appl. No.: 18/723,566

(22) PCT Filed: Apr. 13, 2022

(86) PCT No.: PCT/JP2022/017741
§ 371 (c)(1),
(2) Date: Jun. 24, 2024

(87) PCT Pub. No.: WO2023/199442
PCT Pub. Date: Oct. 19, 2023

(65) Prior Publication Data
US 2026/0164625 A1 Jun. 11, 2026

(51) Int. Cl.
*H05K 7/20* (2006.01)
*B60L 1/14* (2006.01)
(Continued)

(52) U.S. Cl.
CPC ............ *H05K 7/20909* (2013.01); *B60L 1/14* (2013.01); *B60L 15/007* (2013.01); *H02M 7/003* (2013.01);
(Continued)

(58) Field of Classification Search
CPC .......... H02M 7/00; H02M 7/003; H02M 7/02; H02M 7/04; H02M 7/043; H02M 7/05;
(Continued)

(56) References Cited

U.S. PATENT DOCUMENTS

2015/0062812 A1 3/2015 Hwang
2015/0216077 A1 * 7/2015 Tanaka .............. H05K 7/20145 361/689
(Continued)

FOREIGN PATENT DOCUMENTS

JP 2009096460 A 5/2009
JP 2018-198508 A 12/2018

OTHER PUBLICATIONS

International Search Report (PCT/ISA/210) with English translation and Written Opinion (PCT/ISA/237) mailed on Jun. 28, 2022, by the Japanese Patent Office as the International Searching Authority for International Application No. PCT/JP 2022/017741, 8 pages.
Examination Report dated May 20, 2026, issued in the corresponding Indian Patent Application No. 202427072204. (7 pages) .

*Primary Examiner* — Amir A Jalali
(74) *Attorney, Agent, or Firm* — Buchanan Ingersoll & Rooney PC

(57) ABSTRACT

A power conversion device includes power units, blowers to generate airflows passing through the power units, and a housing that accommodates the power units and the blowers. The power conversion device further includes thermally conductive bases, and coolers thermally coupled to the respective bases and disposed outside the housing at positions on both sides of the housing in a horizontal direction. The power units each include capacitors arranged with a void therebetween in a direction away from a main surface of the corresponding base.

20 Claims, 13 Drawing Sheets

(51) Int. Cl.
*B60L 15/00* (2006.01)
*H02M 7/00* (2006.01)

(52) U.S. Cl.
CPC ..... *H05K 7/20409* (2013.01); *H05K 7/20445* (2013.01); *B60L 2200/26* (2013.01)

(58) Field of Classification Search
CPC ........ H02M 7/217; H02M 7/42; H02M 7/493; H02M 7/537; H02M 7/5387; H02M 7/53871; H02M 7/797; H02M 1/0067; H02M 1/08; H02M 1/088; H02M 5/458; H05K 7/02; H05K 7/20409; H05K 7/20445; H05K 7/20509; H05K 7/20863; H05K 7/2089; H05K 7/209; H05K 7/20909; B60L 1/00; B60L 1/14; B60L 3/0092; B60L 15/007; B60L 55/00; B60L 2200/26; B60L 2210/30
See application file for complete search history.

(56) References Cited

U.S. PATENT DOCUMENTS

| | | | | |
|---|---|---|---|---|
| 2017/0237360 | A1* | 8/2017 | Takabayashi | H02M 7/537 363/131 |
| 2019/0020279 | A1* | 1/2019 | Kitanaka | H02M 3/33573 |
| 2019/0208671 | A1* | 7/2019 | Kitanaka | H05K 7/20909 |
| 2020/0367390 | A1* | 11/2020 | Takahashi | H05K 7/20909 |
| 2020/0381317 | A1* | 12/2020 | Takabayashi | H02M 7/003 |

* cited by examiner

POWER CONVERSION DEVICE

TECHNICAL FIELD

The present disclosure relates to a power conversion device.

BACKGROUND ART

Railway vehicles are each provided with a power conversion device. The power conversion device converts electric power fed from a power source into electric power to be fed to load devices, such as motors, lighting equipment, and air conditioners, and feeds the converted electric power to the load devices. This type of power conversion device is disclosed in Patent Literature 1, for example.

CITATION LIST

Patent Literature

Patent Literature 1: Unexamined Japanese Patent Application Publication No. 2009-96460

SUMMARY OF INVENTION

Technical Problem

The components of the power conversion device to be installed in a railway vehicle are accommodated inside a housing that defines a closed space. The components when energized generate heat, but the amounts of heat generation per unit time are different among the components. Such differences in the amounts of heat generation cause a locally high temperature at a certain site inside the housing of the power conversion device, resulting in a high temperature of the component disposed at this site. This phenomenon may be problematic in not only a power conversion device to be installed in a vehicle but also a power conversion device including a component generating a large amount of heat.

An objective of the present disclosure, which has been accomplished in view of the above situations, is to provide a power conversion device prevented from suffering from a locally high temperature inside the housing.

Solution to Problem

In order to achieve the above objective, a power conversion device according to the present disclosure includes power units, blowers, a housing, bases having thermal conductivity, and coolers. The power units each include capacitors connected in series, and a power conversion circuit including primary terminals between which the capacitors are connected. The power conversion circuit converts DC power fed via the capacitors into electric power to be fed to a load device. The blowers are provided for the respective power units to generate airflows passing through the corresponding power units. The housing accommodates the power units and the blowers. The power units are set to the respective bases. The coolers are thermally coupled to the respective bases, and disposed outside the housing at positions on both sides of the housing in a horizontal direction. The capacitors included in each of the power units are arranged with a void therebetween in a direction away from a main surface of the base to which the power unit is set.

Advantageous Effects of Invention

The power conversion device according to the present disclosure includes the power units, and the blowers provided for the respective power units to generate airflows passing through the corresponding power units. The capacitors included in each of the power units are arranged with a void therebetween in a direction away from the main surface of the base to which the power unit is set. The blowers generate airflows passing through the power units generating large amounts of heat, and can thus avoid a locally high temperature inside the housing.

DESCRIPTION OF EMBODIMENTS

Figure 1:
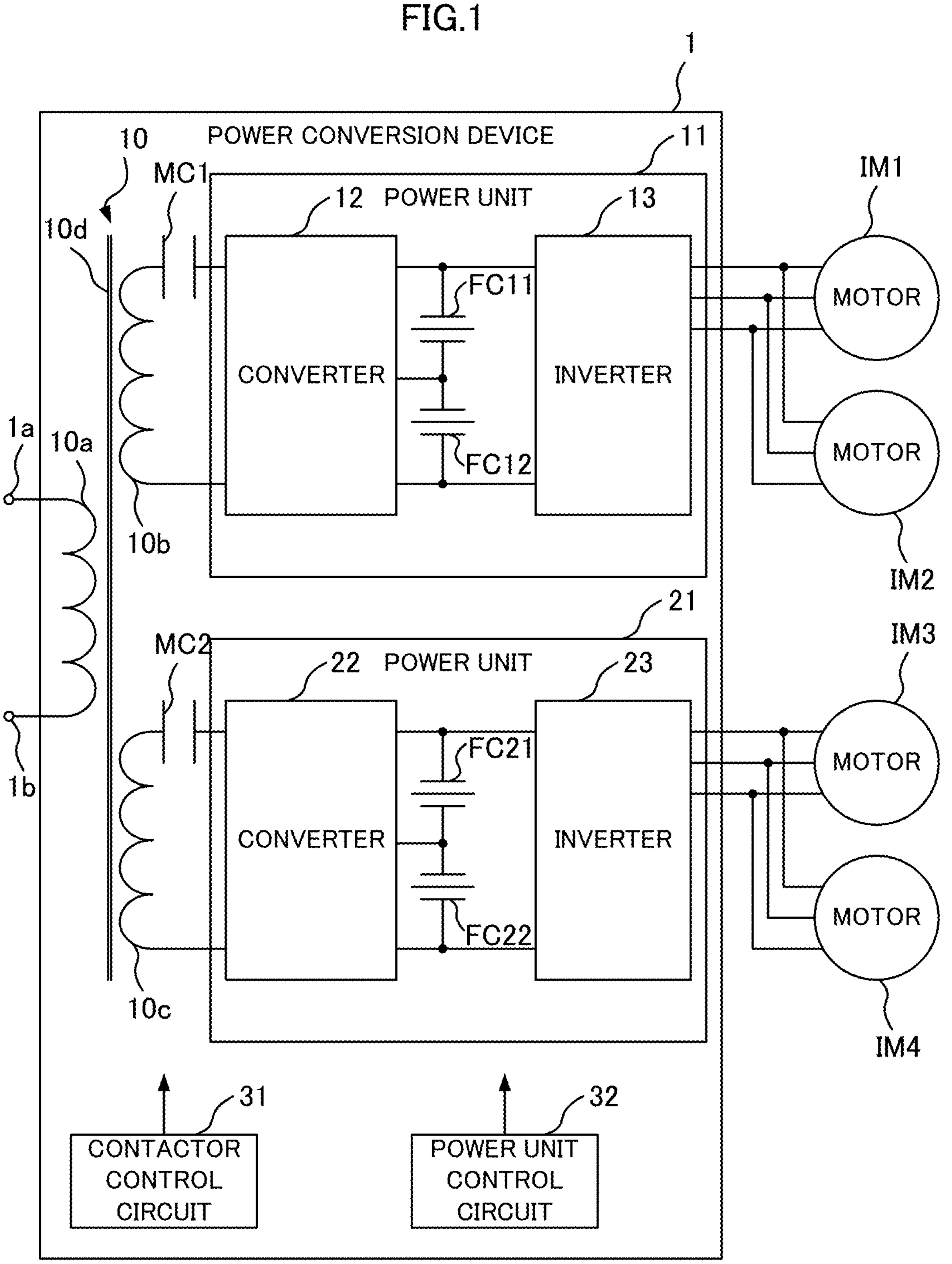
FIG. 1 is a block diagram illustrating a power conversion device according to Embodiment 1.

A power conversion device according to some embodiments is described in detail below with reference to the accompanying drawings. In the drawings, the components identical or corresponding to each other are provided with the same reference symbol.

Embodiment 1

The following describes a power conversion device 1 according to Embodiment 1, focusing on an exemplary power conversion device that is installed in a railway vehicle and feeds electric power to load devices, such as motors, lighting equipment, and air conditioners. The power conversion device 1 illustrated in FIG. 1 converts electric power fed from a power source, which is not illustrated, into electric power to be fed to motors IM1, IM2, IM3, and IM4, which are examples of the load devices. The power conversion device 1 then feeds the converted electric power to the motors IM1, IM2, IM3, and IM4.

The power conversion device 1 includes a terminal la connected to the power source, a specific example of which is a current collector, a grounded terminal 1*b*, a transformer 10 that reduces the voltage of AC power fed from the power source, a power unit 11 that converts the AC power subject to voltage reduction by the transformer 10 into AC power to be fed to the motors IM1 and IM2, and a power unit 21 that converts the AC power subject to voltage reduction by the transformer 10 into AC power to be fed to the motors IM3 and IM4. The current collector acquires electric power from a substation via a power supply line. Examples of the current collector include a pantograph and a contact shoe, and examples of the power supply line include an overhead wire and a third rail.

The power conversion device 1 further includes a contactor MC1 that electrically connects the power unit 11 to the power source or electrically disconnects the power unit 11 from the power source, and a contactor MC2 that electrically connects the power unit 21 to the power source and electrically disconnects the power unit 21 from the power source. The power conversion device 1 also includes a contactor control circuit 31 that closes or opens the contactors MC1 and MC2, and a power unit control circuit 32 that controls switching elements included in the power units 11 and 21.

The power unit 11 includes a converter 12 that converts the AC power subject to voltage reduction by the transformer 10 into DC power and outputs the converted DC power, and filter capacitors FC11 and FC12 to be charged with the DC power output from the converter 12. The power unit 11 further includes an inverter 13 that serves as a power conversion circuit having primary terminals between which the filter capacitors FC11 and FC12 are connected. The inverter 13 converts the DC power fed via the filter capacitors FC11 and FC12 into AC power to be fed to the motors IM1 and IM2, and outputs the converted AC power.

The filter capacitors FC11 and FC12 are connected in series. In detail, one end of the filter capacitor FC11 is electrically connected to the positive-electrode terminal on the secondary side of the converter 12 and one of the primary terminals of the inverter 13. One end of the filter capacitor FC12 is electrically connected to the other end of the filter capacitor FC11 and the neutral terminal on the secondary side of the converter 12. The other end of the filter capacitor FC12 is electrically connected to the negative-electrode terminal on the secondary side of the converter 12 and the other of the primary terminals of the inverter 13.

The power unit 21 includes a converter 22 that converts the AC power subject to voltage reduction by the transformer 10 into DC power and outputs the converted DC power, and filter capacitors FC21 and FC22 to be charged with the DC power output from the converter 22. The power unit 21 further includes an inverter 23 that serves as a power conversion circuit having primary terminals between which the filter capacitors FC21 and FC22 are connected. The inverter 23 converts the DC power fed via the filter capacitors FC21 and FC22 into AC power to be fed to the motors IM3 and IM4, and outputs the converted AC power.

The filter capacitors FC21 and FC22 are connected in series. In detail, one end of the filter capacitor FC21 is electrically connected to the positive-electrode terminal on the secondary side of the converter 22 and one of the primary terminals of the inverter 23. One end of the filter capacitor FC22 is electrically connected to the other end of the filter capacitor FC21 and the neutral terminal on the secondary side of the converter 22. The other end of the filter capacitor FC22 is electrically connected to the negative-electrode terminal on the secondary side of the converter 22 and the other end of the primary terminals of the inverter 23.

The transformer 10 includes a primary winding 10*a* having ends connected to the respective terminals 1*a* and 1*b*, a secondary winding 10*b* electrically connected to the power unit 11, a secondary winding 10*c* electrically connected to the power unit 21, and an iron core 10*d* provided with the primary winding 10*a* and the secondary windings 10*b* and 10*c* wounded therearound.

The contactor MC1 has one end electrically connected to one end of the secondary winding 10*b*, and the other end electrically connected to one of the primary terminals of the converter 12. The contactor MC1 is made of an AC electromagnetic contactor to be closed or opened by the contactor control circuit 31. The contactor MC1, when closed, electrically connects the secondary winding 10*b* to the converter 12. This operation electrically connects the power unit 11 to the power source. The contactor MC1, when opened, electrically disconnects the secondary winding 10*b* from the converter 12. This operation electrically disconnects the power unit 11 from the power source.

The contactor MC2 has one end connected to one end of the secondary winding 10*c*, and the other end connected to one of the primary terminals of the converter 22. The contactor MC2 is made of an AC electromagnetic contactor to be closed or opened by the contactor control circuit 31. The contactor MC2, when closed, electrically connects the secondary winding 10*c* to the converter 22. This operation electrically connects the power unit 21 to the power source. The contactor MC2, when opened, electrically disconnects the secondary winding 10*c* from the converter 22. This operation electrically disconnects the power unit 21 from the power source.

The one of the primary terminals of the converter 12 is electrically connected to the other end of the contactor MC1, and the other of the primary terminals of the converter 12 is electrically connected to the other end of the secondary winding 10*b*. The converter 12 includes multiple switching elements to be turned on or off by the power unit control circuit 32. The converter 12 converts AC power fed via the secondary winding 10*b* into DC power and outputs the DC power. The positive-electrode terminal on the secondary side of the converter 12 is electrically connected to the one end of the filter capacitor FC11. The neutral terminal on the secondary side of the converter 12 is electrically connected to the connecting point between the filter capacitors FC11 and FC12. The negative-electrode terminal on the secondary side of the converter 12 is electrically connected to the other end of the filter capacitor FC12. The filter capacitors FC11 and FC12 are charged with DC power output from the converter 12.

The filter capacitors FC11 and FC12 are connected between the primary terminals of the inverter 13. The inverter 13 includes multiple switching elements to be turned on or off by the power unit control circuit 32. The inverter 13 converts DC power fed via the filter capacitors FC11 and FC12 into AC power and outputs the AC power. The inverter 13 has secondary terminals electrically connected to the motors IM1 and IM2.

The one of the primary terminals of the converter 22 is electrically connected to the other end of the contactor MC2, and the other of the primary terminals of the converter 22 is electrically connected to the other end of the secondary winding 10*c*. The converter 22 includes multiple switching elements to be turned on or off by the power unit control circuit 32. The converter 22 converts AC power fed via the secondary winding 10*c* into DC power and outputs the DC power. The positive-electrode terminal on the secondary side of the converter 22 is electrically connected to the one end of the filter capacitor FC21. The neutral terminal on the secondary side of the converter 22 is electrically connected to the connecting point between the filter capacitors FC21 and FC22. The negative-electrode terminal on the secondary side of the converter 22 is electrically connected to the other end of the filter capacitor FC22. The filter capacitors FC21 and FC22 are charged with DC power output from the converter 22.

The filter capacitors FC21 and FC22 are connected between the primary terminals of the inverter 23. The inverter 23 includes multiple switching elements to be turned on or off by the power unit control circuit 32. The inverter 23 converts DC power fed via the filter capacitors FC21 and FC22 into AC power and outputs the AC power. The inverter 23 has secondary terminals electrically connected to the motors IM3 and IM4.

The motors IM1, IM2, IM3, and IM4 are made of three-phase induction motors, for example. The motors IM1, IM2, IM3, and IM4 are fed with electric power from the power conversion device 1 and thus rotate. This rotation generates a propulsion of the railway vehicle. For example, one vehicle body is provided with two bogies. Whereas one of the bogies is provided with the motors IM1 and IM2, the other bogie is provided with the motors IM3 and IM4.

The contactor control circuit 31 closes the contactors MC1 and MC2 at the start of operation of the railway vehicle. For example, the contactor control circuit 31 closes the contactors MC1 and MC2, in response to a manipulation on a switch to cause a pantograph, which is an example of the current collector, to rise and come into contact with the overhead wire.

The power unit control circuit 32 acquires a driving instruction for the railway vehicle from a cab, which is not illustrated, and controls the switching operations of the switching elements included in each of the converters 12 and 22 and the inverters 13 and 23 in accordance with the driving instruction. The driving instruction contains any of a power running instruction for instructing the railway vehicle to accelerate, a braking instruction for instructing the railway vehicle to decelerate, or a coasting instruction for instructing the railway vehicle to coast. The coasting instruction indicates a condition in which neither the power running instruction nor the braking instruction is acquired. In detail, the power unit control circuit 32 generates control commands for controlling the respective switching elements included in the converters 12 and 22 and the inverters 13 and 23 in accordance with the driving instruction, and transmits the control commands to the corresponding switching elements included in the converters 12 and 22 and the inverters 13 and 23.

Figure 2:
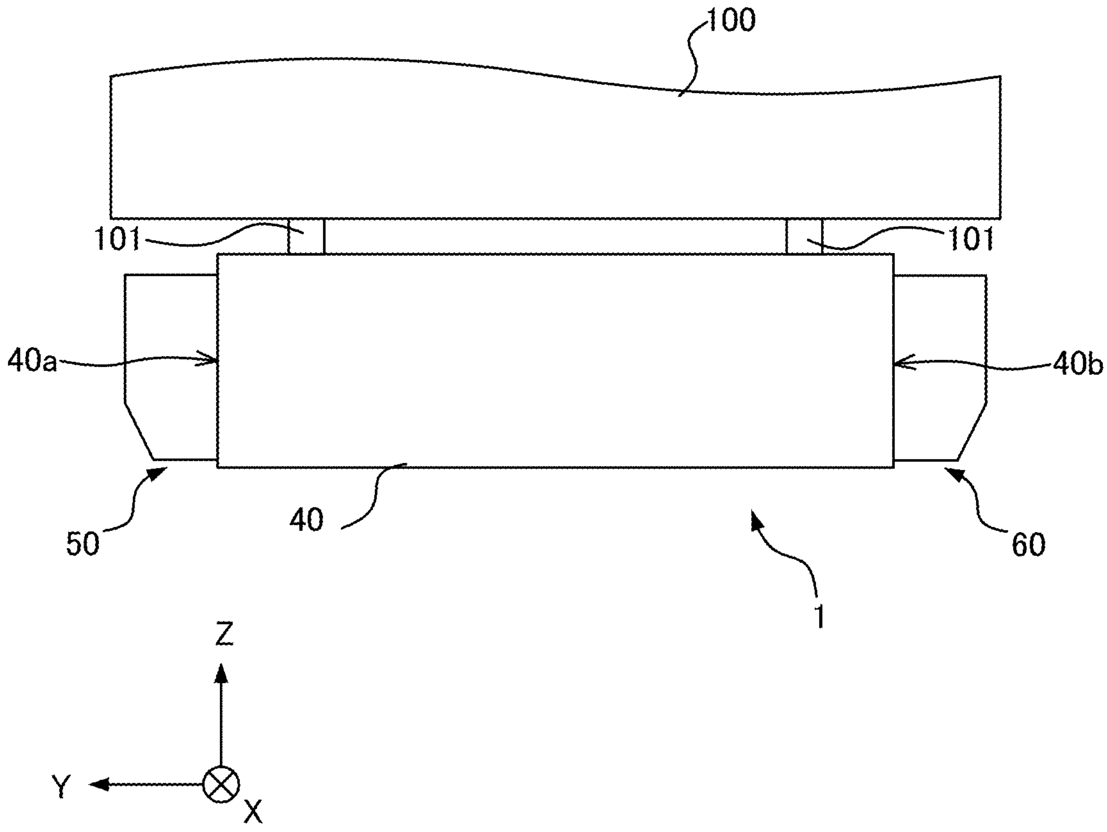
FIG. 2 illustrates an exemplary manner of installation of the power conversion device according to Embodiment 1 in a railway vehicle.

The above-described components of the power conversion device 1 are accommodated in a housing 40 illustrated in FIG. 2. The housing 40 is installed under the floor of a vehicle body 100 of the railway vehicle with fitting members 101. The power conversion device 1 further includes coolers 50 and 60. The cooler 50 is thermally coupled to the power unit 11 accommodated in the housing 40, and discharges the heat transferred from the power unit 11 to the ambient air and thus cools the power unit 11. The cooler 60 is thermally coupled to the power unit 21 accommodated in the housing 40, and discharges the heat transferred from the power unit 21 to the ambient air and thus cools the power unit 21. In FIG. 2, the X axis represents the traveling direction of the railway vehicle, and the Y axis represents the width direction of the vehicle body 100. The Z axis is orthogonal to the X and Y axes. The Z axis represents the vertical direction while the railway vehicle is horizontally oriented. The same holds true for the subsequent drawings.

The housing 40 is made of a material rigid enough to resist deformation of the material by vibrations during running of the railway vehicle. Examples of the material include metals, such as aluminum, iron, and stainless-steel. The housing 40 is attached to the vehicle body 100 tightly enough to prevent displacement of a relative positional relationship between the vehicle body 100 and the housing 40 by vibrations during running of the railway vehicle.

The coolers 50 and 60 are disposed outside the housing 40 at positions on both sides of the housing 40 in a horizontal direction, specifically, in the Y-axis direction. The sum of the Y-axis widths of the coolers 50 and 60 and the Y-axis width of the housing 40 are preferably substantially equal to the Y-axis width of the vehicle body 100. This structure can achieve efficient use of the space under the floor of the vehicle body 100.

Figure 3:
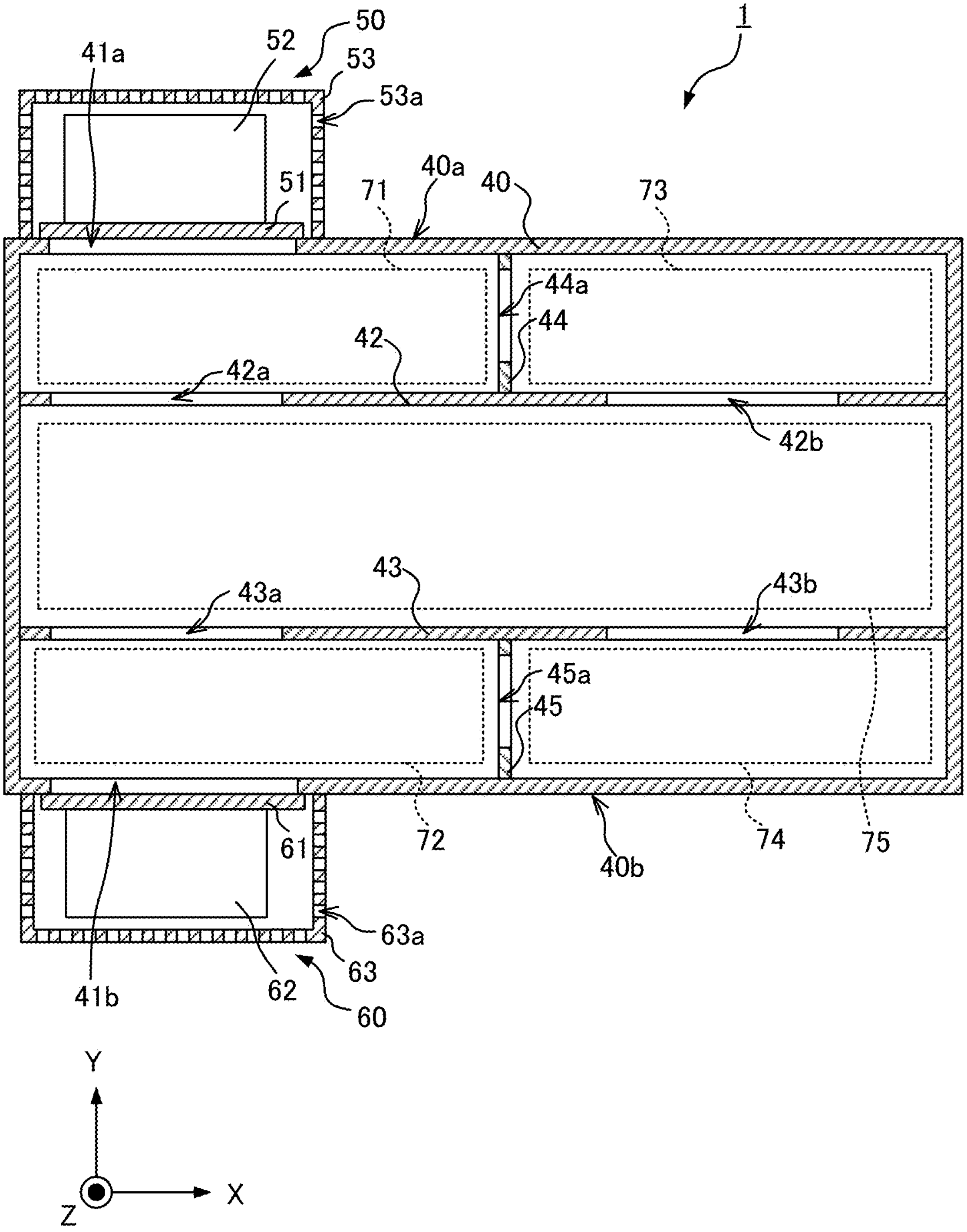
FIG. 3 is a sectional view of a housing according to Embodiment 1.

The interior of the housing 40 that accommodates the components of the power conversion device 1 is partitioned into multiple compartments. In detail, as illustrated in FIG. 3, the power conversion device 1 includes two first partition members 42 and 43 that partition the interior of the housing 40. The first partition members 42 and 43 are spaced from each other in the direction in which two walls 40*a* and 40*b* of the housing 40 are opposed to each other, that is, in the Y-axis direction. The first partition members 42 and 43 are oriented such that the individual main surfaces extend in parallel to the walls 40*a* and 40*b*. For example, the first partition members 42 and 43 have a flat plate shape and are attached to the inner surfaces of the housing 40 while being oriented such that the main surfaces are orthogonal to the Y axis.

The power conversion device 1 preferably further includes a second partition member 44 that partitions the space between the wall 40*a* and the first partition member 42 disposed adjacent to the wall 40*a*, and a second partition member 45 that partitions the space between the wall 40*b* and the first partition members 43 disposed adjacent to the wall 40*b*. The second partition members 44 and 45 extend in the direction in which the two walls 40*a* and 40*b* are opposed to each other, that is, in the Y-axis direction and the Z-axis direction. The second partition member 44 is attached to the wall 40*a*, the first partition member 42, and the inner surfaces of the housing 40, and partitions the space between the wall 40*a* and the first partition member 42. The second partition member 45 is attached to the wall 40*b*, the first partition member 43, and the inner surfaces of the housing 40, and partitions the space between the wall 40*b* and the first partition member 43.

The first partition members 42 and 43 and the second partition members 44 and 45 divide the interior of the housing 40 into a first compartment 71, a second compartment 72, a third compartment 73, a fourth compartment 74, and a fifth compartment 75. In detail, the first compartment 71 is defined between the wall 40*a* and the first partition member 42, and located more adjacent to the negative side along the X axis than the second partition member 44. The second compartment 72 is defined between the wall 40*b* and the first partition member 43, and located more adjacent to the negative side along the X axis than the second partition member 45. The third compartment 73 is defined between the wall 40*a* and the first partition member 42, and located more adjacent to the positive side along the X axis than the second partition member 44. The fourth compartment 74 is defined between the wall 40*b* and the first partition member 43, and located more adjacent to the positive side along the X axis than the second partition member 45. The fifth compartment 75 is defined between the first partition members 42 and 43.

The first partition member 42 has first air holes 42*a* and 42*b*. The first partition member 43 has first air holes 43*a* and 43*b*. The second partition member 44 has a second air hole 44*a*. The second partition member 45 has a second air hole 45*a*. These air holes allow the air inside the housing 40 to circulate through the first compartment 71, the second compartment 72, the third compartment 73, the fourth compartment 74, and the fifth compartment 75.

The components of the power conversion device 1 are arranged in the housing 40, as described below with reference to FIG. 4. The components of the power conversion device 1, specifically, the electronic components included in the power conversion device 1 all generate heat when energized, but amounts of heat generation are different from each other. For example, the amounts of heat generation of the power units 11 and 21 per unit time are larger than the amounts of heat generation of the contactor control circuit 31, the power unit control circuit 32, and the contactors MC1 and MC2 per unit time.

The power unit 11 generating a large amount of heat is disposed at a position adjacent to the wall 40*a* corresponding to the Y-axis end, specifically, disposed between the wall 40*a* and the first partition member 42 adjacent to the wall 40*a*. For example, the power unit 11 is accommodated in the first compartment 71 and thermally coupled to the cooler 50. The part of the wall 40*a* that faces the first compartment 71 accommodating the power unit 11 has an opening 41*a*. The opening 41*a* allows for maintenance of the power unit 11 accommodated in the first compartment 71.

The opening 41*a* is closed by a thermally conductive base 51. The base 51 is made of a material having high thermal conductivity. Examples of the material include metals, such as aluminum and iron. The base 51 has a flat plate shape, for example, and is attached to the housing 40, specifically, the outer surface of the wall 40*a* while being oriented such that one of the main surfaces closes the opening 41*a*. The power unit 11 is attached to the surface of the base 51 that faces the opening 41*a*.

The cooler 50 is thermally coupled to the base 51, and discharges heat transferred from the power unit 11 via the base 51. In detail, the cooler 50 includes multiple fins 52 mounted on the base 51, and a cover 53 attached to the housing 40 so as to cover the base 51 and the fins 52.

The fins 52 are made of flat plate members. The fins 52 are attached to the other main surface of the base 51, such that the main surfaces of the fins 52 are orthogonal to the Z axis and the fins 52 are spaced from each other in the Z-axis direction. The cover 53 has air holes 53*a*, which allow the ambient air to enter the cover 53 and flow between the fins 52.

The cooler 50 discharges heat to the cooling air flowing along the outer surface of the wall 40*a*. For example, running of the railway vehicle generates a traveling wind flowing in the direction opposite to the traveling direction of the railway vehicle. This traveling wind enters the cover 53, flows between the fins 52, and is guided along the wall 40*a*. The traveling wind receives heat from the fins 52 and thus cools the power unit 11.

Figure 4:
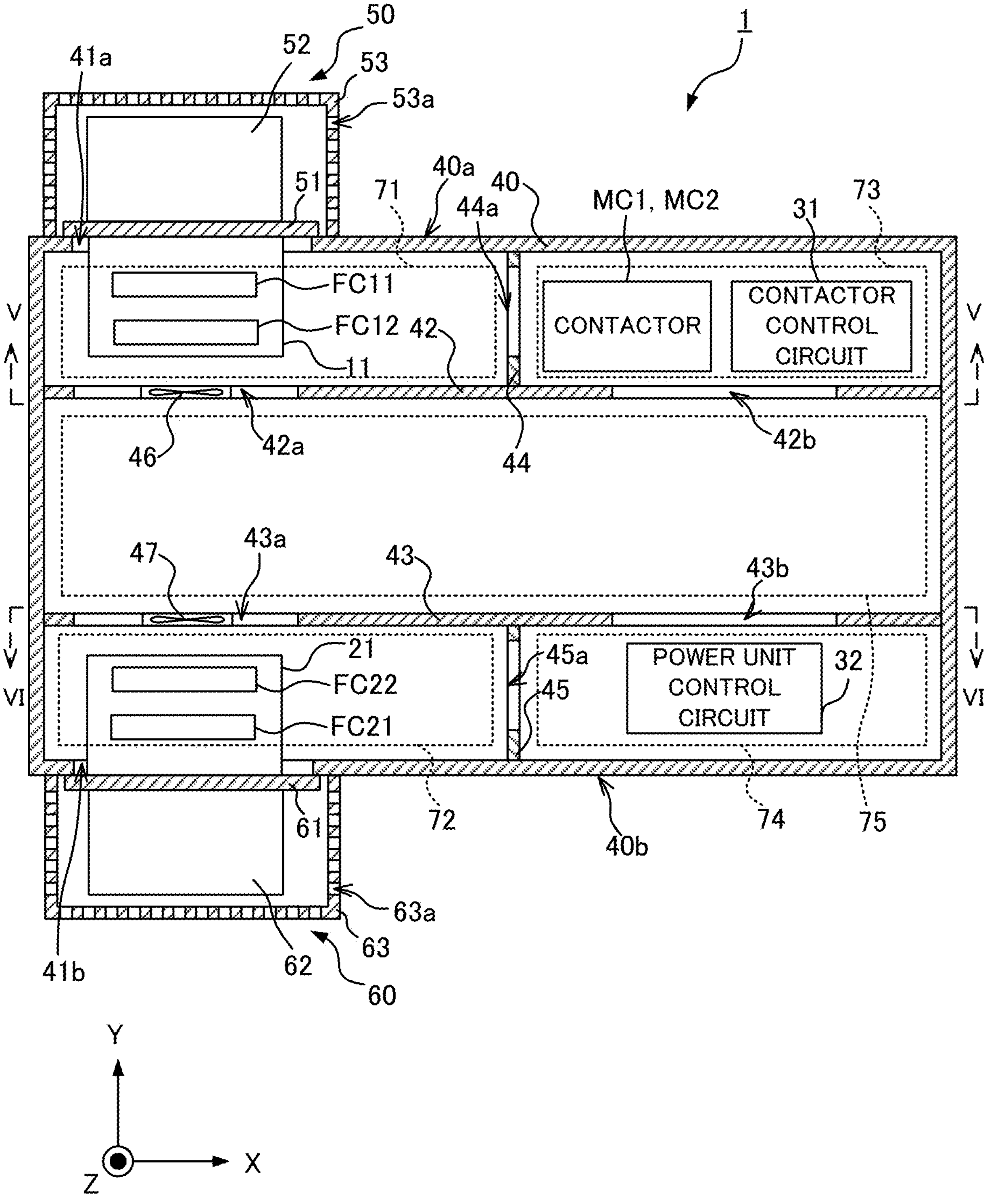
FIG. 4 illustrates an exemplary manner of arrangement of components of the power conversion device according to Embodiment 1.

FIG. 4 illustrates the filter capacitors FC11 and FC12 alone as the components of the power unit 11, in order to simplify the figure. The filter capacitors FC11 and FC12 are arranged with a void therebetween in a direction away from the main surface of the base 51 to which the power unit 11 is attached, specifically, toward the negative side along the Y axis. The filter capacitors FC11 and FC12 are attached to the base 51 with fitting members, which are not illustrated. The switching elements included in the converter 12 and the switching elements included in the inverter 13 are attached to the base 51, although these structures are not illustrated.

The power unit 21 generating a large amount of heat is disposed at a position adjacent to the wall 40*b* corresponding to the Y-axis end, specifically, disposed between the wall 40*b* and the first partition member 43 disposed adjacent to the wall 40*b*. For example, the power unit 21 is accommodated in the second compartment 72 and thermally coupled to the cooler 60. The part of the wall 40*b* that faces the second compartment 72 accommodating the power unit 21 has an opening 41*b*. The opening 41*b* allows for maintenance of the power unit 21 accommodated in the second compartment 72.

The opening 41*b* is closed by a thermally conductive base 61. The base 61 is made of a material having high thermal conductivity. Examples of the material include metals, such as aluminum and iron. The base 61 has a flat plate shape, for example, and is attached to the housing 40, specifically, the outer surface of the wall 40*b* while being oriented such that one of the main surfaces closes the opening 41*b*. The power unit 21 is attached to the surface of the base 61 that faces the opening 41*b*.

The cooler 60 is thermally coupled to the base 61, and discharges heat transferred from the power unit 21 via the base 61. In detail, the cooler 60 includes multiple fins 62 mounted on the base 61, and a cover 63 attached to the housing 40 so as to cover the base 61 and the fins 62.

The fins 62 are made of flat plate members. The fins 62 are attached to the other main surface of the base 61, such that the main surfaces of the fins 62 are orthogonal to the Z axis and the fins 62 are spaced from each other in the Z-axis direction. The cover 63 has air holes 63*a*, which allow the ambient air to enter the cover 63 and flow between the fins 62.

The cooler 60 discharges heat to the cooling air flowing along the outer surface of the wall 40*b*. For example, running of the railway vehicle generates a traveling wind flowing in the direction opposite to the traveling direction of the railway vehicle. This traveling wind enters the cover 63, flows between the fins 62, and is guided along the wall 40*b*. The traveling wind receives heat from the fins 62 and thus cools the power unit 21.

FIG. 4 illustrates the filter capacitors FC21 and FC22 alone as the components of the power unit 21, in order to simplify the figure. The filter capacitors FC21 and FC22 are arranged with a void therebetween in a direction away from the main surface of the base 61 to which the power unit 21 is attached, specifically, toward the positive side along the Y axis. The filter capacitors FC21 and FC22 are attached to the base 61 with fitting members, which are not illustrated. The switching elements included in the converter 22 and the switching elements included in the inverter 23 are attached to the base 61, although these structures are not illustrated.

The contactors MC1 and MC2 and the contactor control circuit 31 are disposed at positions adjacent to the power unit 11 across the second partition member 44. For example, the contactors MC1 and MC2 and the contactor control circuit 31 are accommodated in the third compartment 73.

The power unit control circuit 32 is disposed at a position adjacent to the power unit 21 across the second partition member 45. For example, the power unit control circuit 32 is accommodated in the fourth compartment 74.

The fifth compartment 75 accommodates elements, such as electric wires and bus bars, that electrically connect the individual components of the power conversion device 1 with each other, although these structures are not illustrated.

The air temperatures in the first compartment 71 and the second compartment 72, which accommodate the power units 11 and 21 generating large amounts of heat, are higher than those in the other compartments, specifically, the third compartment 73, the fourth compartment 74, and the fifth compartment 75. In order to avoid a locally high temperature inside the housing 40, the power conversion device 1 further includes blowers 46 and 47 provided for the respective power units 11 and 21. The blowers 46 and 47 generate airflows passing through the corresponding power units 11 and 21. The blowers 46 and 47 are accommodated in the housing 40.

In detail, the power conversion device 1 includes the blower 46 disposed in the vicinity of the first air hole 42*a*, and the blower 47 disposed in the vicinity of the first air hole 43*a*. The vicinities of the first air holes 42*a* and 43*a* respectively mean positions inside the first air holes 42*a* and 43*a* and positions around the first air holes 42*a* and 43*a*. For example, the blowers 46 and 47 are respectively provided to the inner walls of the first air holes 42*a* and 43*a*, the main surfaces of the first partition members 42 and 43, or the portions of the inner surfaces of the housing 40 adjacent to the first partition members 42 and 43.

The blowers 46 and 47 are driven by electric power fed from a power source, which is not illustrated, during the operation of the power units 11 and 21. For example, the blowers 46 and 47 are fed with electric power from the power source that feeds electric power to other in-vehicle devices, such as air conditioners and lighting equipment. The blowers 46 and 47 acquire control commands from the power unit control circuit 32, and are driven during the switching operations of the switching elements included in at least either of the power units 11 and 21.

Figure 5:
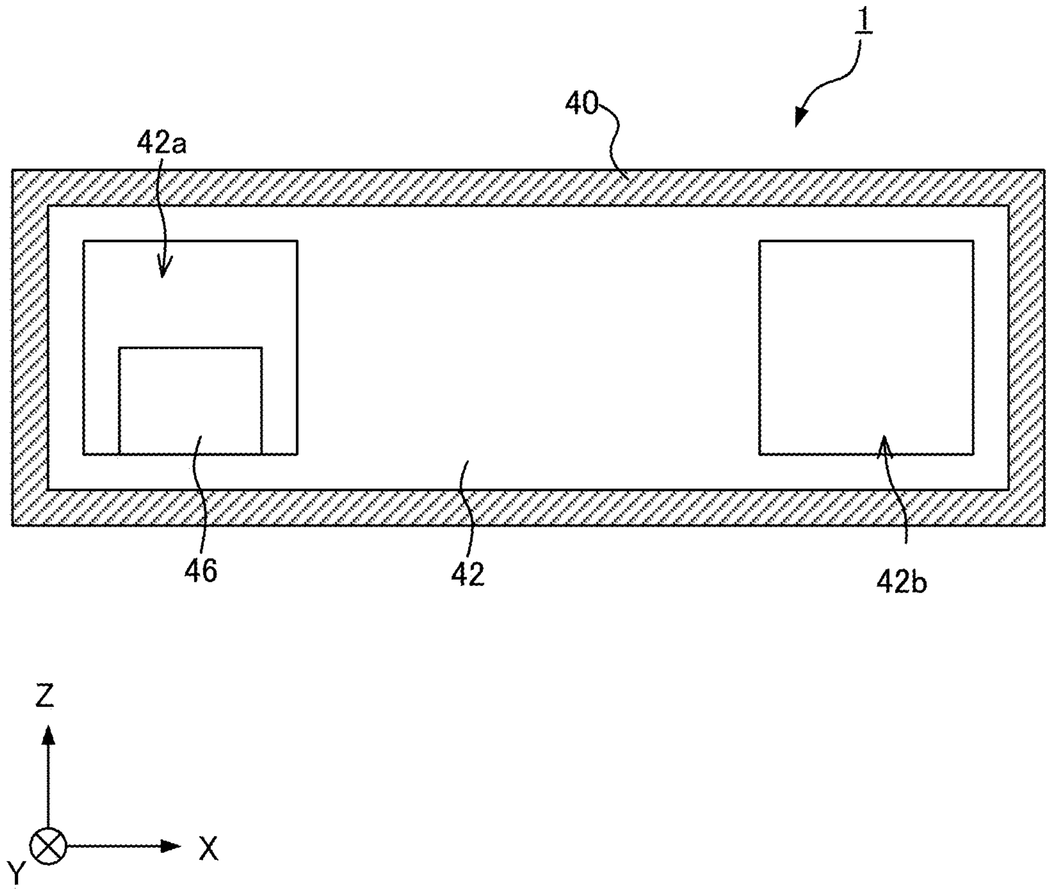
FIG. 5 is a sectional view of the power conversion device according to Embodiment 1 taken along the line V-V of FIG. 4.

The blower 46 generates an airflow passing through the power unit 11. The blower 46 is an axial fan, for example. The blower 46 is oriented such that the rotational axis is parallel to the Y axis, and delivers air toward the power unit 11. In other words, the blower 46 delivers air from the fifth compartment 75 that accommodates electronic components generating small amounts of heat, to the first compartment 71 that accommodates electronic components generating large amounts of heat. In view of the characteristics of cool air existing vertically below and warm air existing vertically above, the blower 46 is preferably disposed vertically below in the vicinity of the first air hole 42*a*, as illustrated in FIG. 5, which is a sectional view taken along the line V-V of FIG. 4.

Since the filter capacitors FC11 and FC12 are arranged with a void therebetween as described above, the air delivered from the blower 46 flows through the void between the filter capacitors FC11 and FC12. This flowing air cools the filter capacitors FC11 and FC12.

Figure 6:
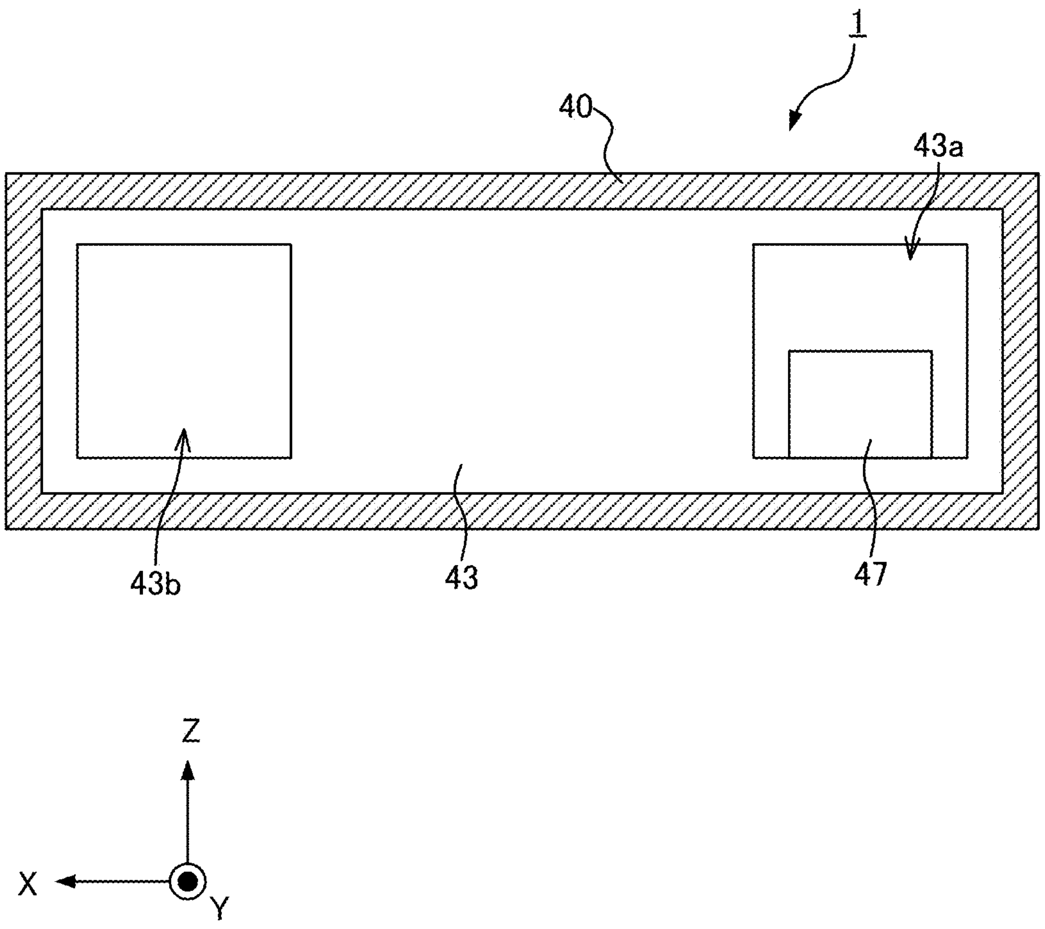
FIG. 6 is a sectional view of the power conversion device according to Embodiment 1 taken along the line VI-VI of FIG. 4.

The blower 47 illustrated in FIG. 4 generates an airflow passing through the power unit 21. The blower 47 is an axial fan, for example. The blower 47 is oriented such that the rotational axis is parallel to the Y axis, and delivers air toward the power unit 21. In other words, the blower 47 delivers air from the fifth compartment 75 that accommodates electronic components generating small amounts of heat, to the second compartment 72 that accommodates electronic components generating large amounts of heat. In view of the characteristics of cool air existing vertically below and warm air existing vertically above, the blower 47 is preferably disposed vertically below in the vicinity of the first air hole 43*a*, as illustrated in FIG. 6, which is a sectional view of taken along the line VI-VI of FIG. 4.

Since the filter capacitors FC21 and FC22 are arranged with a void therebetween as described above, the air delivered from the blower 47 flows through the void between the filter capacitors FC21 and FC22. This flowing air cools the filter capacitors FC21 and FC22.

Figure 7:
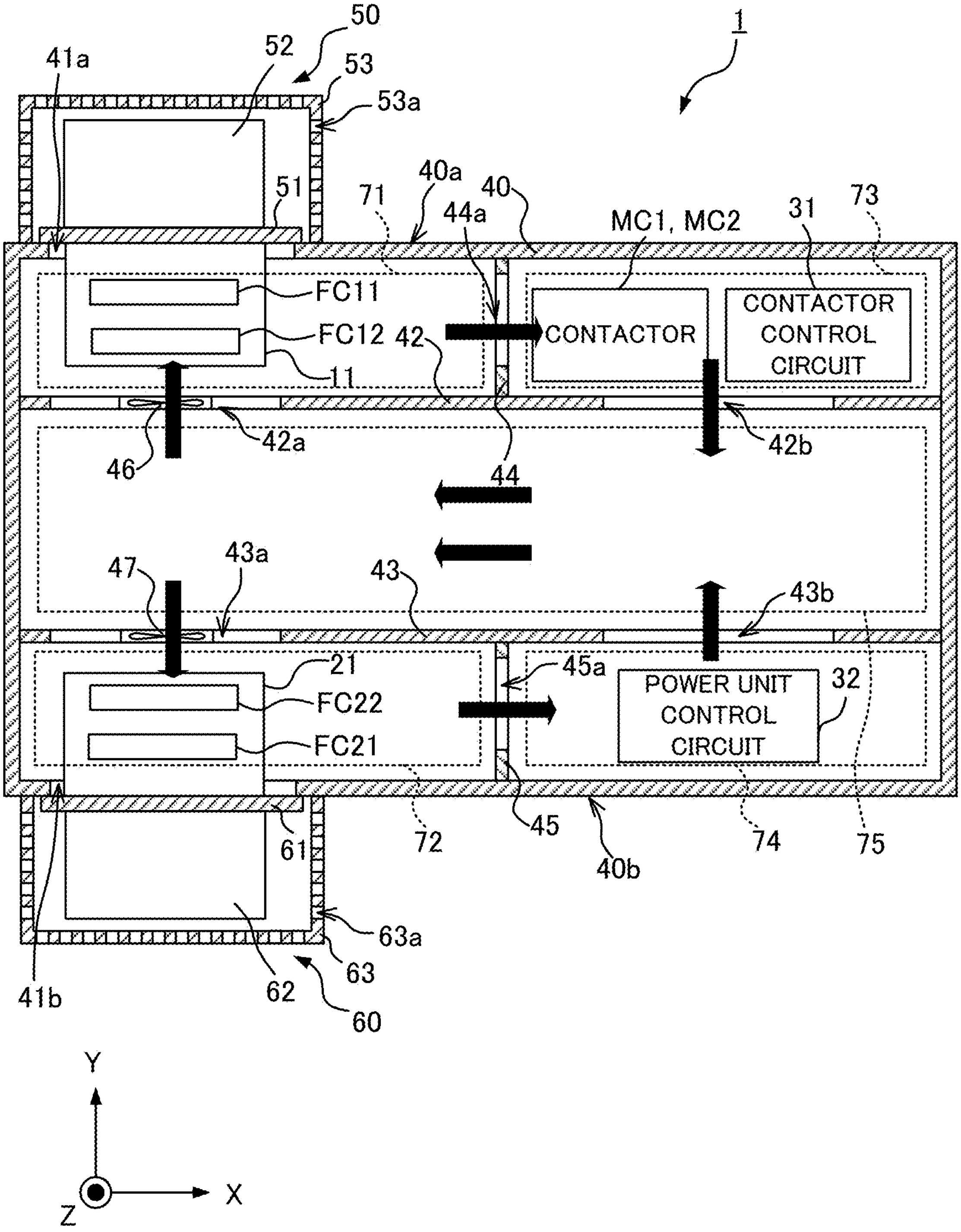
FIG. 7 illustrates exemplary airflows in the power conversion device according to Embodiment 1.

The operations of the blowers 46 and 47 induce circulation of the air inside the housing 40, as represented by the arrows in FIG. 7. In detail, the operation of the blower 46 generates an airflow from the fifth compartment 75 through the first air hole 42*a* toward the first compartment 71. The air that has been introduced from the fifth compartment 75 into the first compartment 71 flows through the second air hole 44*a* into the third compartment 73. The air that has entered the third compartment 73 flows through the first air hole 42*b* into the fifth compartment 75. The air that has entered the fifth compartment 75 is guided toward the negative side along the X axis, and flows through the first air hole 42*a* into the first compartment 71.

The operation of the blower 47 generates an airflow from the fifth compartment 75 through the first air hole 43*a* toward the second compartment 72. The air that has been introduced from the fifth compartment 75 into the second compartment 72 flows through the second air hole 45*a* into the fourth compartment 74. The air that has entered the fourth compartment 74 flows through the first air hole 43*b* into the fifth compartment 75. The air that has entered the fifth compartment 75 is guided toward the negative side along the X axis, and flows through the first air hole 43*a* into the second compartment 72.

As described above, the blowers 46 and 47 in the power conversion device 1 according to Embodiment 1 generate airflows passing through the power units 11 and 21 generating large amounts of heat, and can thus avoid a locally high temperature inside the housing 40.

The filter capacitors FC11 and FC12 arranged with a void therebetween can allow the air delivered from the blower 46 to flow through the void between the filter capacitors FC11 and FC12. The filter capacitors FC21 and FC22 arranged with a void therebetween can allow the air delivered from the blower 47 to flow through the void between the filter capacitors FC21 and FC22. These structures can achieve efficient cooling of the filter capacitors FC11, FC12, FC21, and FC22 generating large amounts of heat.

Embodiment 2

The blowers 46 and 47 may be disposed at positions other than those in the above-described example. The following describes a power conversion device 2 according to Embodiment 2 that includes blowers 46 and 47 disposed at positions different from those in the power conversion device 1, focusing on the differences from Embodiment 1.

Figure 8:
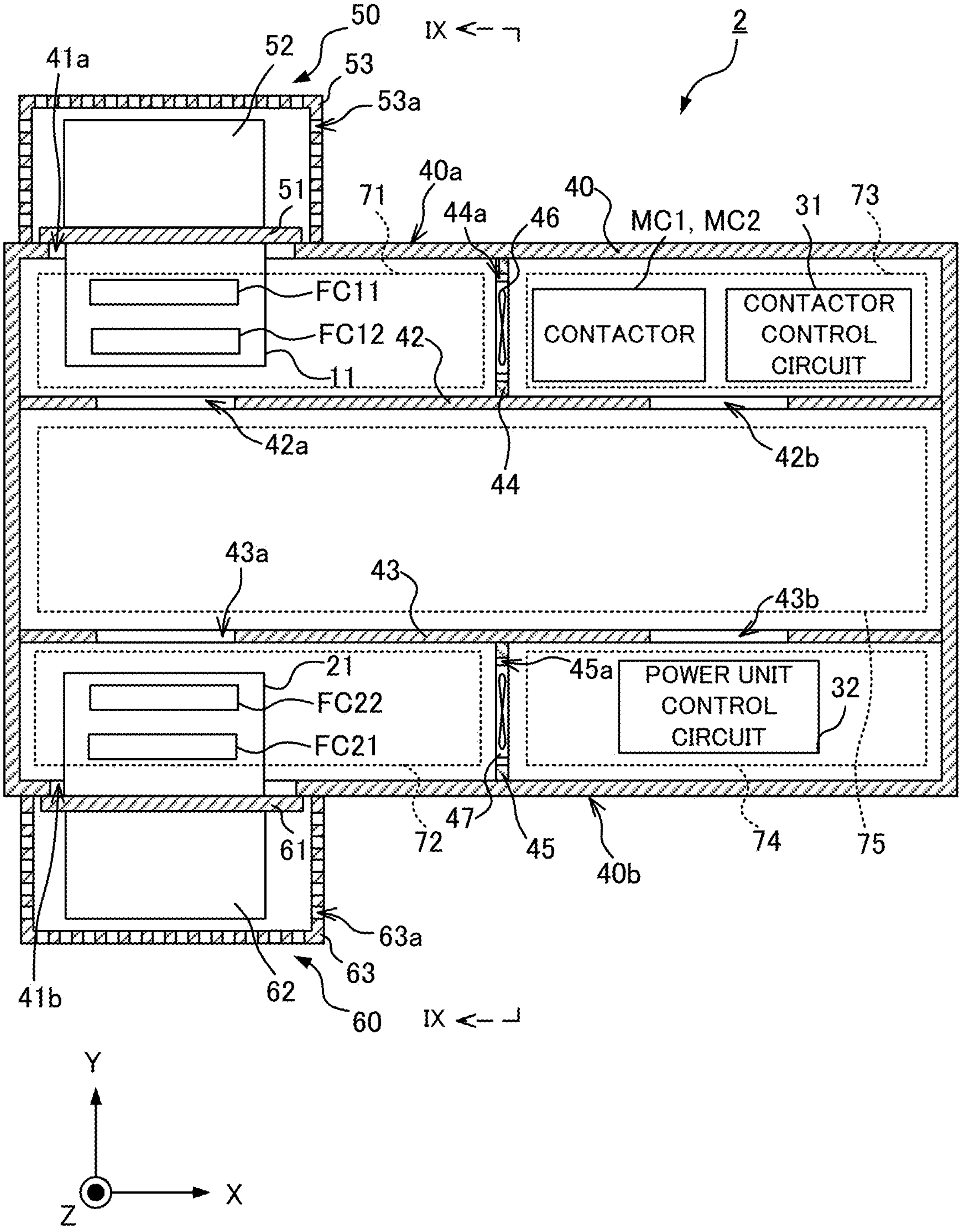
FIG. 8 illustrates an exemplary manner of arrangement of components of a power conversion device according to Embodiment 2.

The power conversion device 2 illustrated in FIG. 8 has the configuration identical to that of the power conversion device 1, except for the positions of the blowers 46 and 47. The blowers 46 and 47 in the power conversion device 2 are respectively disposed in the vicinities of the second air holes 44*a* and 45*a*. The vicinities of the second air holes 44*a* and 45*a* respectively mean positions inside the second air holes 44*a* and 45*a* and the positions around the second air holes 44*a* and 45*a*. For example, the blowers 46 and 47 are respectively provided to the inner walls of the second air holes 44*a* and 45*a*, the main surfaces of the second partition members 44 and 45, or the portions of the inner surfaces of the housing 40 adjacent to the second partition members 44 and 45.

Figure 9:
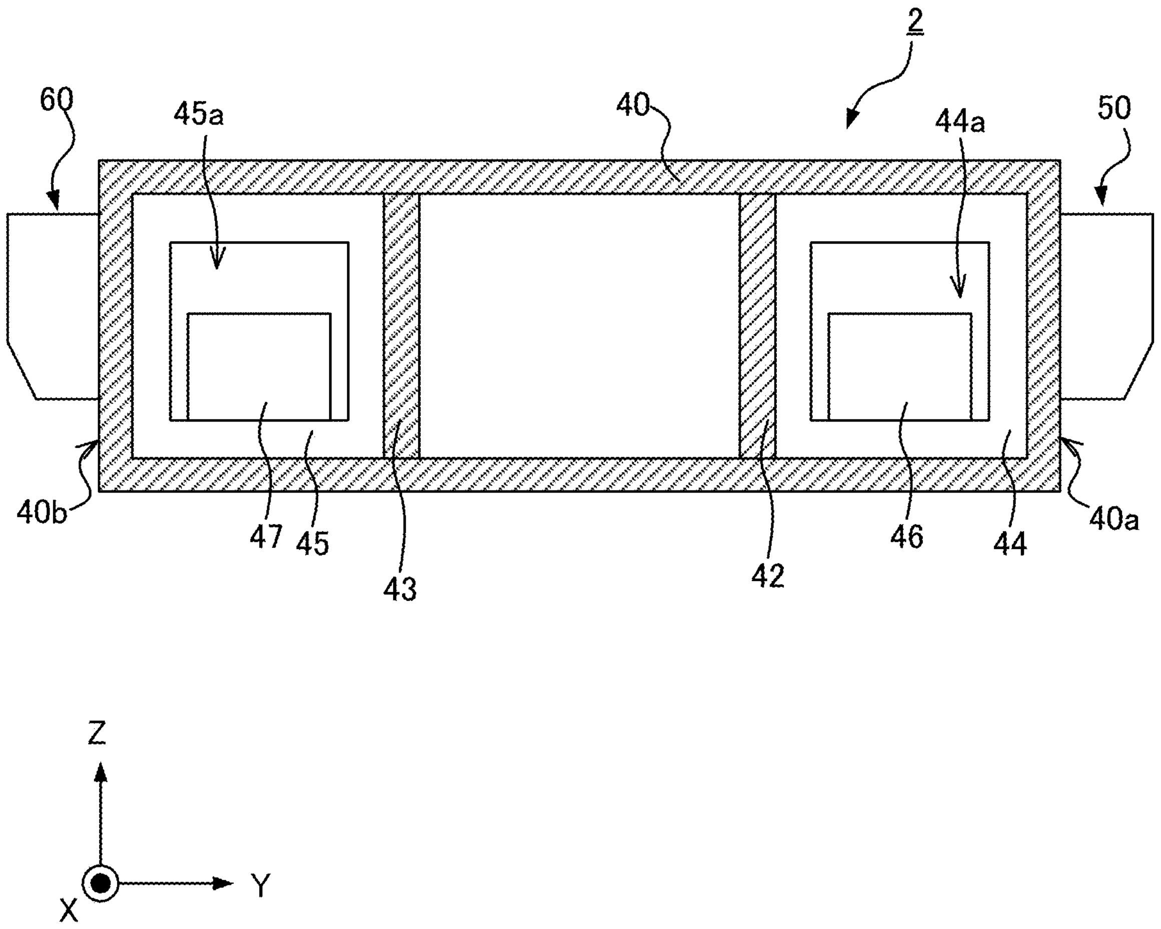
FIG. 9 is a sectional view of the power conversion device according to Embodiment 2 taken along the line IX-IX of FIG. 8.

The blower 46 generates an airflow passing through the power unit 11. The blower 46 is an axial fan, for example. The blower 46 is oriented such that the rotational axis is parallel to the X axis, and delivers air toward the power unit 11, specifically, the void between the filter capacitors FC11 and FC12. In other words, the blower 46 delivers air from the third compartment 73 that accommodates electronic components generating small amounts of heat, to the first compartment 71 that accommodates electronic components generating large amounts of heat. In view of the characteristics of cool air existing vertically below and warm air existing vertically above, the blower 46 is preferably disposed vertically below in the vicinity of the second air hole 44*a*, as illustrated in FIG. 9, which is a sectional view taken along the line IX-IX of FIG. 8. This structure facilitates the cool air existing vertically below in the third compartment 73 to flow smoothly to the first compartment 71.

The filter capacitors FC11 and FC12 arranged with a void therebetween in the Y-axis direction, as in Embodiment 1, can allow the air delivered from the blower 46 to flow in the X-axis direction through the void between the filter capacitors FC11 and FC12. Such an airflow can efficiently cool the filter capacitors FC11 and FC12.

The blower 47 illustrated in FIG. 8 generates an airflow passing through the power unit 21. The blower 47 is an axial fan, for example. The blower 47 is oriented such that the rotational axis is parallel to the X axis, and delivers air toward the power unit 21, specifically, the void between the filter capacitors FC21 and FC22. In other words, the blower 47 delivers air from the fourth compartment 74 that accommodates electronic components generating small amounts of heat, to the second compartment 72 that accommodates electronic components generating large amounts of heat. In view of the characteristics of cool air existing vertically below and warm air existing vertically above, the blower 47 is preferably disposed vertically below in the vicinity of the second air hole 45*a*, as illustrated in FIG. 9. This structure facilitates the cool air existing vertically below in the fourth compartment 74 to flow smoothly to the second compartment 72.

The filter capacitors FC21 and FC22 arranged with a void therebetween in the Y-axis direction, as in Embodiment 1, can allow the air delivered from the blower 47 to flow in the X-axis direction through the void between the filter capacitors FC21 and FC22. Such an airflow can efficiently cool the filter capacitors FC21 and FC22.

Figure 10:
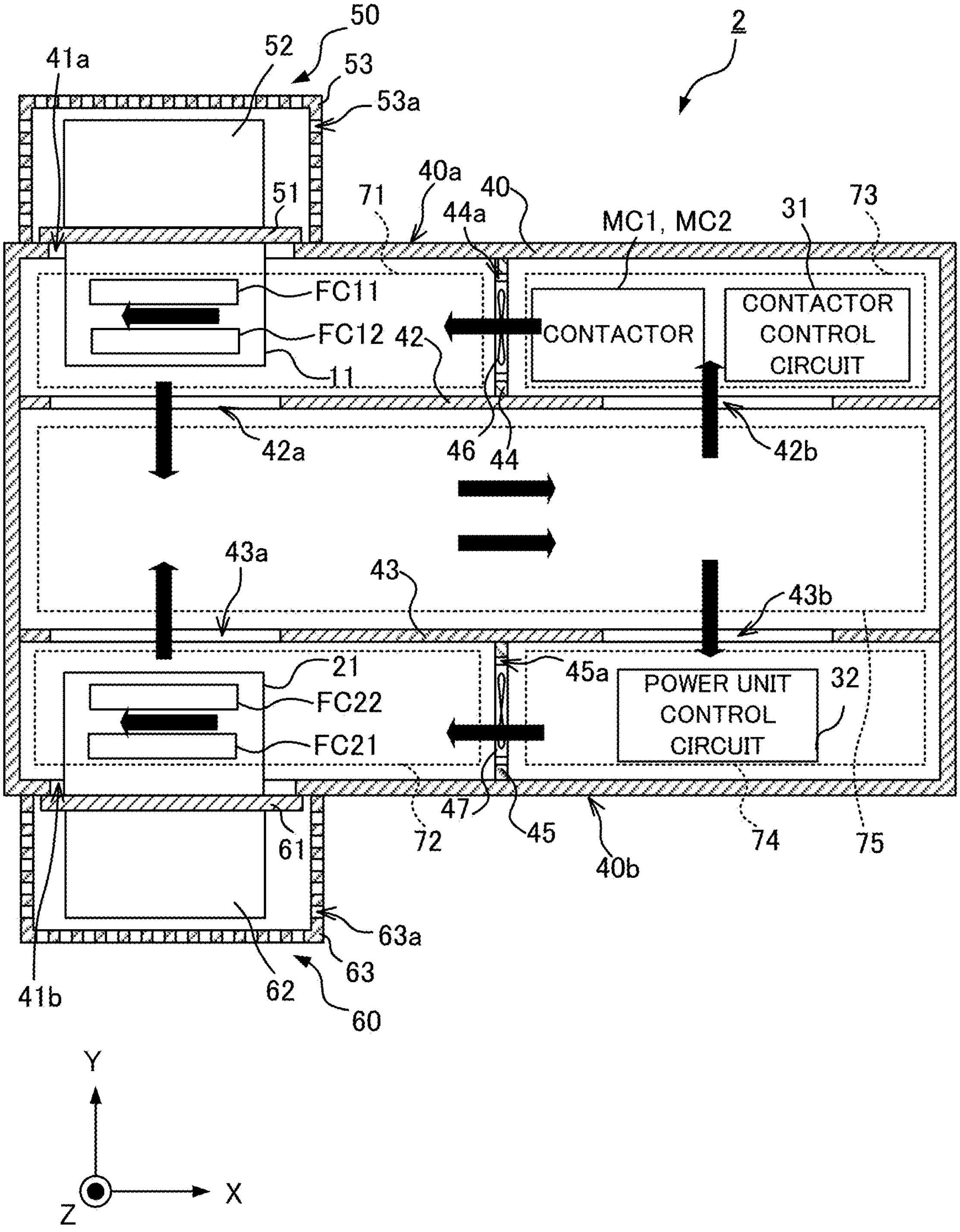
FIG. 10 illustrates exemplary airflows in the power conversion device according to Embodiment 2.

The operations of the blowers 46 and 47 induce circulation of the air inside the housing 40, as represented by the arrows in FIG. 10. In detail, the operation of the blower 46 generates an airflow from the third compartment 73 through the second air hole 44*a* toward the first compartment 71. At least part of the air that has been introduced from the third compartment 73 into the first compartment 71 flows through the void between the filter capacitors FC11 and FC12 toward the negative side along the X axis. The air that has entered the first compartment 71 flows through the first air hole 42*a* into the fifth compartment 75. The air that has entered the fifth compartment 75 is guided toward the positive side along the X axis, and flows through the first air hole 42*b* into the third compartment 73.

The operation of the blower 47 generates an airflow from the fourth compartment 74 through the second air hole 45*a* toward the second compartment 72. At least part of the air that has been introduced from the fourth compartment 74 into the second compartment 72 flows through the void between the filter capacitors FC21 and FC22 toward the negative side along the X axis. The air that has entered the second compartment 72 flows through the first air hole 43*a* into the fifth compartment 75. The air that has entered the fifth compartment 75 is guided toward the positive side along the X axis, and flows through the first air hole 43*b* into the fourth compartment 74.

As described above, the blowers 46 and 47 in the power conversion device 2 according to Embodiment 2 generate airflows passing through the power units 11 and 21 generating large amounts of heat, and can thus avoid a locally high temperature inside the housing 40. The blower 46 delivers air toward the negative side along the X axis against the filter capacitors FC11 and FC12 arranged with a void therebetween in the Y-axis direction, and thus causes the air to flow in the X-axis direction along the outer surfaces of the casings of the filter capacitors FC11 and FC12. Such an airflow can achieve efficient cooling of the filter capacitors FC11 and FC12.

The blower 47 delivers air in the X-axis direction against the filter capacitors FC21 and FC22 arranged with a void therebetween in the Y-axis direction, and thus causes the air to flow in the X-axis direction along the outer surfaces of the casings of the filter capacitors FC21 and FC22. Such an airflow can achieve efficient cooling of the filter capacitors FC21 and FC22.

Embodiment 3

The housing 40 may have a structure other than that in the above-described examples. The following describes a power conversion device 3 according to Embodiment 3 that includes a housing 40 having a structure different from that in Embodiments 1 and 2, focusing on the differences from Embodiments 1 and 2.

Figure 11:
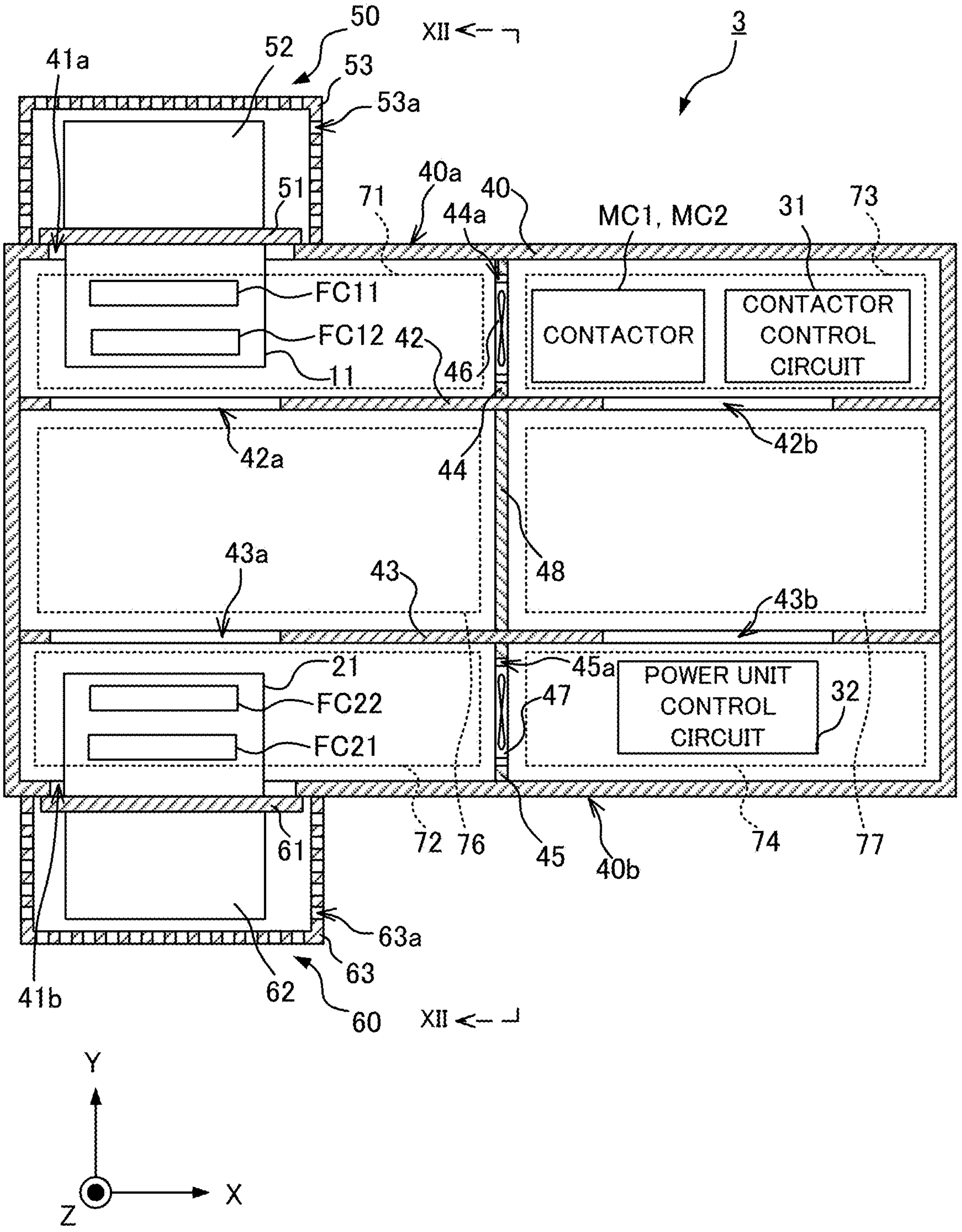
FIG. 11 illustrates an exemplary manner of arrangement of components of a power conversion device according to Embodiment 3.

The power conversion device 3 illustrated in FIG. 11 includes, in addition to the components of the power conversion device 2, a third partition member 48 that partitions the space between the first partition members 42 and 43. The compartment defined between the first partition members 42 and 43, and located more adjacent to the negative side along the X axis than the third partition member 48 is called a sixth compartment 76. The compartment defined between the first partition members 42 and 43, and located more adjacent to the positive side along the X axis than the third partition member 48 is called a seventh compartment 77.

The blowers 46 and 47 are respectively disposed in the vicinities of the second air holes 44*a* and 45*a* as in Embodiment 2, but the blower 47 delivers air in a direction different from that in Embodiment 2. In detail, the blower 47 delivers air in a direction away from the power unit 21. For example, the blower 47 draws the air existing in the void between the filter capacitors FC21 and FC22 toward the positive side along the X axis. In other words, the blower 47 delivers air from the second compartment 72 that accommodates electronic components generating large amounts of heat, to the fourth compartment 74 that accommodates electronic components generating small amounts of heat.

Figure 12:
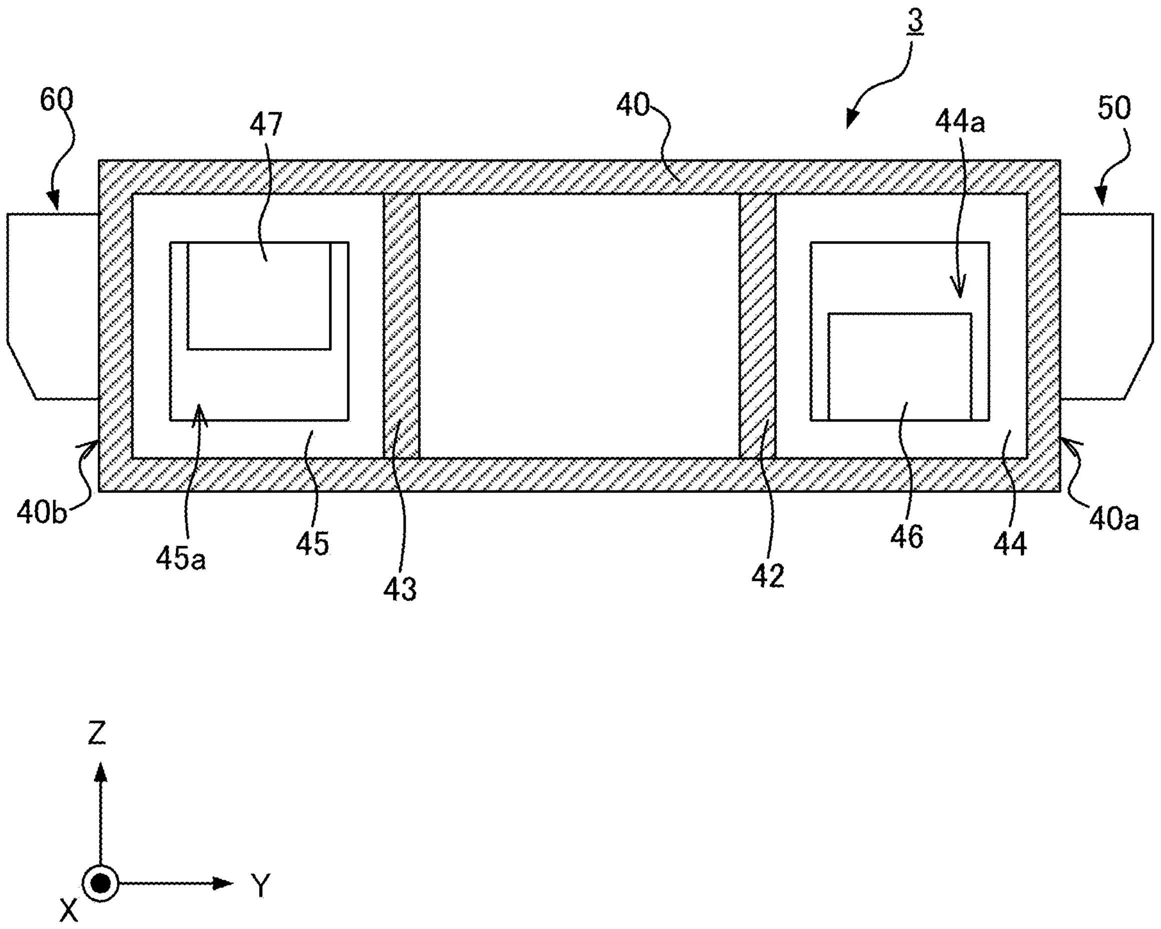
FIG. 12 is a sectional view of the power conversion device according to Embodiment 3 taken along the line XII-XII of FIG. 11.

In view of the characteristics of cool air existing vertically below and warm air existing vertically above, the blower 47 is preferably disposed vertically above in the vicinity of the second air hole 45*a*, as illustrated in FIG. 12, which is a sectional view taken along the line XII-XII of FIG. 11. This structure facilitates the warm air existing vertically above in the second compartment 72 to flow smoothly to the fourth compartment 74.

Figure 13:
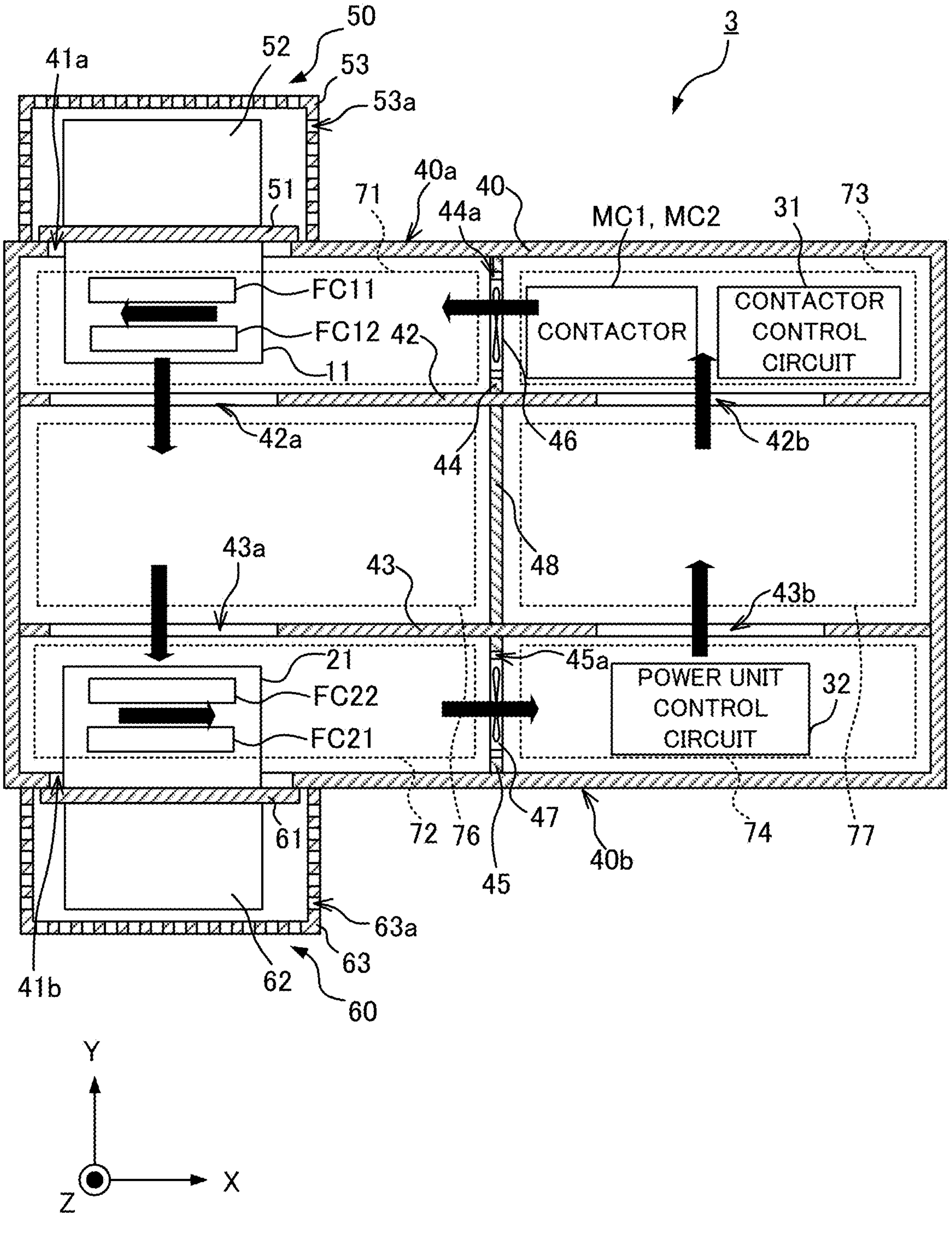
FIG. 13 illustrates exemplary airflows in the power conversion device according to Embodiment 3.

The operations of the blowers 46 and 47 induce circulation of the air inside the housing 40, as represented by the arrows in FIG. 13. In detail, the operation of the blower 46 generates an airflow from the third compartment 73 through the second air hole 44*a* toward the first compartment 71. At least part of the air that has been introduced from the third compartment 73 into the first compartment 71 flows through the void between the filter capacitors FC11 and FC12 toward the negative side along the X axis. The air that has entered the first compartment 71 flows through the first air hole 42*a* into the sixth compartment 76. The air that has entered the sixth compartment 76 is then guided toward the negative side along the Y axis, and flows through the first air hole 43*a* into the second compartment 72.

The operation of the blower 47 generates an airflow from the second compartment 72 through the second air hole 45*a* toward the fourth compartment 74.

The blower 47 draws the air in the second compartment 72 toward the fourth compartment 74. For example, the air between the filter capacitors FC21 and FC22 in the second compartment 72 flows toward the positive side along the X axis. The air that has been introduced from the second compartment 72 into the fourth compartment 74 flows through the first air hole 43*b* into the seventh compartment 77. The air that has entered the seventh compartment 77 is then guided toward the positive side along the Y axis, and flows through the first air hole 42*b* into the third compartment 73.

As described above, the blowers 46 and 47 in the power conversion device 3 according to Embodiment 3 generate airflows passing through the power units 11 and 21 generating large amounts of heat, and can thus avoid a locally high temperature inside the housing 40. The blower 46 delivers air toward the negative side along the X axis against the filter capacitors FC11 and FC12 arranged with a void therebetween in the Y-axis direction, and thus causes the air to flow in the X-axis direction along the outer surfaces of the casings of the filter capacitors FC11 and FC12. Such an airflow can achieve efficient cooling of the filter capacitors FC11 and FC12.

The blower 47 draws the air toward the positive side along the X axis against the filter capacitors FC21 and FC22 arranged with a void therebetween in the Y-axis direction, and thus causes the air to flow in the X-axis direction along the outer surfaces of the casings of the filter capacitors FC21 and FC22. Such an airflow can achieve efficient cooling of the filter capacitors FC21 and FC22.

The above-described embodiments are not to be construed as limiting the scope of the present disclosure. The above-described embodiments may be arbitrarily combined with each other. For example, the power conversion device 1 illustrated in FIG. 4 may further include an additional blower 46 disposed in the vicinity of the second air hole 44*a* and an additional blower 47 disposed in the vicinity of the second air hole 45*a*, as in Embodiment 2. In this case, the additional blower 46 delivers air in a direction away from the power unit 11, specifically, toward the positive side along the X axis, and the additional blower 47 delivers air in a direction away from the power unit 21, specifically, toward the positive side along the X axis.

The power conversion device 1 may have any circuit configuration other than that in the above-described examples, provided that the power conversion device 1 includes power units each including multiple capacitors. For example, the power conversion device 1 may be a multilevel inverter or a direct-current-direct-current (DC-DC) converter.

For another example, the power conversion device 1 may include overvoltage suppression resistors for suppressing overvoltage in the power units 11 and 21. For example, one of the overvoltage suppression resistors for suppressing overvoltage in the power unit 11 may be accommodated in the first compartment 71 together with the power unit 11. Another of the overvoltage suppression resistors for suppressing overvoltage in the power unit 21 may be accommodated in the second compartment 72 together with the power unit 21.

For another example, the power conversion device 1 may include charging resistors for suppressing inrush current in the filter capacitors FC11 and FC12 included in the power unit 11 and the filter capacitors FC21 and FC22 included in the power unit 21. For example, one of the charging resistors for suppressing inrush current in the filter capacitors FC11 and FC12 may be accommodated in the first compartment 71 together with the power unit 11. Another of the charging resistors for suppressing inrush current in the filter capacitors FC21 and FC22 may be accommodated in the second compartment 72 together with the power unit 21.

The power conversion device 1 may feed electric power to any electronic equipment as the load device, other than the motors IM1, IM2, IM3, and IM4.

The fifth compartment 75 may accommodate sensors, which are not illustrated, for example, current sensors that measure values of phase current output from the power units 11 and 21.

The blowers 46 and 47 may be replaced with any number of blowers and may be disposed at any position other than those in the above-described examples, provided that the blowers can cool the power units 11 and 21 generating large amounts of heat. For example, the power conversion device 1 may include, in addition to the components illustrated in FIG. 4, a blower disposed in the vicinity of the first air hole 42*b* and a blower disposed in the vicinity of the first air hole 43*b*.

Each of the power conversion devices 1 to 3 may also be installed in a railway vehicle of a DC feeding system, as well as a railway vehicle of an AC feeding system. Each of the power conversion devices 1 to 3 may be installed in any moving body, such as automobile, aircraft, or marine vessel, other than the railway vehicle.

The first partition members 42 and 43 and the second partition members 44 and 45 may have different shapes and may be disposed at different positions determined depending on the sizes of the power units 11 and 21, other than those in the above-described examples. For example, the first partition members 42 and 43 and the second partition members 44 and 45 may have a curved surface.

The first partition member 42 and the second partition member 44 may be integrally formed. The first partition member 43 and the second partition member 45 may be integrally formed. The first partition members 42 and 43, the second partition members 44 and 45, and the third partition member 48 may be integrally formed.

The housing 40 may be installed at a position other than the position under the floor of the vehicle body 100. For example, the housing 40 may be mounted on the roof of the vehicle body 100.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1, 2, 3 Power conversion device
1*a*, 1*b* Terminal
10 Transformer
10*a* Primary winding
10*b*, 10*c* Secondary winding
10*d* Iron core
11, 21 Power unit
12, 22 Converter
13, 23 Inverter
31 Contactor control circuit
32 Power unit control circuit
40 Housing
40*a*, 40*b* Wall
41*a*, 41*b* Opening
42, 43 First partition member
42*a*, 42*b*, 43*a*, 43*b* First air hole
44, 45 Second partition member
44*a*, 45*a* Second air hole
46, 47 Blower
48 Third partition member
50, 60 Cooler
51, 61 Base
52, 62 Fin
53, 63 Cover
53*a*, 63*a* Air hole
71 First compartment
72 Second compartment
73 Third compartment
74 Fourth compartment
75 Fifth compartment
76 Sixth compartment
77 Seventh compartment
100 Vehicle body
101 Fitting member
FC11, FC12, FC21, FC22 Filter capacitor
IM1, IM2, IM3, IM4 Motor
MC1, MC2 Contactor

The invention claimed is:

1. A power conversion device, comprising:
power units each including
capacitors connected in series, and
a power conversion circuit including primary terminals between which the capacitors are connected, the power conversion circuit being configured to convert DC power fed via the capacitors into electric power to be fed to a load device;
blowers provided for the respective power units to generate airflows passing through the corresponding power units;
a housing configured to accommodate the power units and the blowers;
bases having thermal conductivity and to which the respective power units are provided; and
coolers thermally coupled to the respective bases and disposed outside the housing at positions on both sides of the housing in a horizontal direction, wherein the capacitors included in each of the power units are arranged with a void therebetween.

2. The power conversion device according to claim 1, wherein each of the blowers generates an airflow passing through the void between the capacitors included in the corresponding power unit.

3. The power conversion device according to claim 2, wherein
at least one of the bases is fixed to one of two walls of the housing, the two walls being located between the coolers and opposed to each other in a horizontal direction, and
at least another one of the bases is fixed to the other of the two walls.

4. The power conversion device according to claim 3, wherein
the power units include two power units disposed at positions adjacent to the respective one of the two walls, and
each of the coolers discharges heat transferred from the power unit via the base that is thermally coupled, to cooling air flowing along an outer surface of the respective one of the two walls to which the base is fixed.

5. The power conversion device according to claim 3, further comprising:
two first partition members spaced from each other in a direction in which the two walls are opposed to each other, oriented such that main surfaces of the two first partition members extend in parallel to the two walls, and configured to partition an interior of the housing, wherein
each of the power units is disposed between one of the two walls and one of the two first partition members adjacent to the respective one of the two walls.

6. The power conversion device according to claim 5, wherein each of the two first partition members includes a first air hole.

7. The power conversion device according to claim 6, wherein each of the blowers is disposed in a vicinity of the corresponding first air hole.

8. The power conversion device according to claim 1, wherein
at least one of the bases is fixed to one of two walls of the housing, the two walls being located between the coolers and opposed to each other in a horizontal direction, and
at least another one of the bases is fixed to the other of the two walls.

9. The power conversion device according to claim 8, wherein
the power units include two power units disposed at positions adjacent to the respective one of the two walls, and
each of the coolers discharges heat transferred from the power unit via the base that is thermally coupled, to cooling air flowing along an outer surface of the respective one of the two walls to which the base is fixed.

10. The power conversion device according to claim 8, further comprising:
two first partition members spaced from each other in a direction in which the two walls are opposed to each other, oriented such that main surfaces of the two first partition members extend in parallel to the two walls, and configured to partition an interior of the housing, wherein each of the power units is disposed between one of the two walls and one of the two first partition members adjacent to the respective one of the two walls.

11. The power conversion device according to claim 10, wherein each of the two first partition members includes a first air hole.

12. The power conversion device according to claim 11, wherein each of the blowers is disposed in a vicinity of the corresponding first air hole.

13. The power conversion device according to claim 12, wherein the blowers deliver air toward the respective power units.

14. The power conversion device according to claim 10, further comprising:

at least one second partition member having a main surface extending in the direction in which the two walls are opposed to each other and in a vertical direction, and each partitioning a space between one of the two walls and one of the two first partition members adjacent to the one of the two walls.

15. The power conversion device according to claim 14, further comprising:

a power unit control circuit to control switching elements included in each of the power units, wherein the power unit control circuit is disposed at a position adjacent to any of the power units across the at least one second partition member.

16. The power conversion device according to claim 14, further comprising:

a contactor to electrically connect each of the power units to a power source or electrically disconnect each of the power units from the power source, wherein the contactor is disposed at a position adjacent to any of the power units across the at least one second partition member.

17. The power conversion device according to claim 16, further comprising:

a contactor control circuit to close or open the contactor, wherein the contactor control circuit is disposed at a position adjacent to any of the power units across the at least one second partition member.

18. The power conversion device according to claim 14, wherein each of the at least one second partition member includes a second air hole.

19. The power conversion device according to claim 18 wherein each of the blowers is disposed in a vicinity of the second air hole.

20. The power conversion device according to claim 19, wherein the at least one second partition member includes two second partition members, one of the two second partition members partitions a space between one of the two walls and one of the two first partition members adjacent to the respective one of the two walls, the other of the two second partition members partitions a space between the other of the two walls and the other of the two first partition members adjacent to the other one of the two walls, one of the blowers disposed vertically above in a vicinity of the second air hole of the one second partition member delivers air in a direction away from the corresponding power unit, and another of the blowers disposed vertically below in a vicinity of the second air hole of the other second partition member delivers air toward the corresponding power unit.

* * * * *